(12) United States Patent
Wayama et al.

(10) Patent No.: US 8,878,972 B2
(45) Date of Patent: Nov. 4, 2014

(54) IMAGING APPARATUS, RADIATION IMAGING SYSTEM, AND METHOD FOR DRIVING IMAGING APPARATUS

(71) Applicant: Canon Kabushiki Kaisha, Tokyo (JP)

(72) Inventors: Hiroshi Wayama, Saitama (JP); Chiori Mochizuki, Sagamihara (JP); Minoru Watanabe, Honjo (JP); Keigo Yokoyama, Honjo (JP); Masato Ofuji, Honjo (JP); Jun Kawanabe, Kodama-gun (JP); Kentaro Fujiyoshi, Kumagaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 13/678,139

(22) Filed: Nov. 15, 2012

(65) Prior Publication Data

US 2013/0162859 A1 Jun. 27, 2013

(30) Foreign Application Priority Data

Dec. 21, 2011 (JP) ................ 2011-279751

(51) Int. Cl.
*H04N 3/14* (2006.01)
*G02F 1/1343* (2006.01)
*H01L 27/148* (2006.01)
*H04N 5/232* (2006.01)
*H04N 5/32* (2006.01)
*H04N 5/341* (2011.01)
*H01L 27/146* (2006.01)

(52) U.S. Cl.
CPC ...... *H01L 27/14806* (2013.01); *H04N 5/23229* (2013.01); *H04N 5/32* (2013.01); *H04N 5/341* (2013.01); *H01L 27/14612* (2013.01); *H01L 27/14658* (2013.01)

USPC .......................................... 348/294; 349/139

(58) Field of Classification Search
USPC .......................................... 348/294; 349/139
See application file for complete search history.

(56) References Cited

U.S. PATENT DOCUMENTS

| | | | |
|---|---|---|---|
| 7,205,547 B2 | 4/2007 | Ishii et al. | |
| 7,205,568 B2 | 4/2007 | Watanabe et al. | |
| 7,435,968 B2 | 10/2008 | Watanabe et al. | |
| 7,470,908 B2 | 12/2008 | Ishii et al. | |
| 7,488,948 B2 | 2/2009 | Ishii et al. | |
| 7,535,506 B2 | 5/2009 | Nomura et al. | |
| 7,541,617 B2 | 6/2009 | Mochizuki et al. | |
| 7,557,355 B2 | 7/2009 | Mochizuki et al. | |
| 7,629,564 B2 | 12/2009 | Mochizuki et al. | |
| 7,645,976 B2 | 1/2010 | Watanabe et al. | |
| 7,812,313 B2 | 10/2010 | Mochizuki et al. | |
| 7,897,930 B2 | 3/2011 | Mochizuki et al. | |
| 7,932,946 B2 | 4/2011 | Ishii et al. | |
| 8,067,743 B2 | 11/2011 | Ishii et al. | |
| 8,368,027 B2 | 2/2013 | Ishii et al. | |
| 2004/0141131 A1* | 7/2004 | Ishikawa et al. | 349/139 |
| 2010/0277592 A1 | 11/2010 | Yokoyama et al. | |
| 2010/0294942 A1 | 11/2010 | Mochizuki et al. | |
| 2013/0162833 A1 | 6/2013 | Wayama et al. | |

FOREIGN PATENT DOCUMENTS

JP 2006-345330 A 12/2006

* cited by examiner

*Primary Examiner* — Joel Fosselman
(74) *Attorney, Agent, or Firm* — Fitzpatrick, Cella, Harper & Scinto (57) ABSTRACT

A source follower connection line connects a gate of a source follower thin film transistor in a first pixel with a gate of a source follower thin film transistor in a second pixel, between adjacent first and second pixel, and a driving circuit turns the transfer thin film transistor in the first pixel region ON and turns the transfer thin film transistor in the second pixel OFF to make the transfer thin film transistor in the first pixel region output the signal of the first pixel.

9 Claims, 10 Drawing Sheets

FIG. 13

IMAGING APPARATUS, RADIATION IMAGING SYSTEM, AND METHOD FOR DRIVING IMAGING APPARATUS

BACKGROUND OF THE INVENTION

1. Field of the Invention

The present invention relates to an imaging apparatus, a radiation imaging system, and a method for driving the imaging apparatus.

2. Description of the Related Art

In recent years, a technology for manufacturing a liquid crystal panel using a TFT (thin film transistor) is used in an imaging apparatus such as a radiation imaging apparatus in which the TFT is combined with a semiconductor conversion element. In the imaging apparatus, a technique is proposed which uses a source follower circuit (SFTFT) when reading a signal accumulated in the semiconductor conversion element to a signal line (see Japanese Patent Application Laid-Open No. 2006-345330).

SUMMARY OF THE INVENTION

However, in the case in which the source follower circuit is applied to an imaging apparatus, when the signal is read, the delay corresponding to a time constant occurs which is defined by a product of the resistance of the source follower circuit and the wiring capacitance of the signal line. In the case of the radiation imaging apparatus, the size is approximately 40 cm×40 cm, the time constant is extremely large, and the speed of reading the signal results in not being sufficiently adequate. Thus, in a method of reading the signal in Japanese Patent Application Laid-Open No. 2006-345330, the speed of reading the signal causes the delay due to the resistance that the source follower circuit has, which causes a large problem, particularly, in high-speed driving.

The present invention is designed with respect to the above described problems, and provides a highly reliable imaging apparatus and radiation imaging system which enhances the speed of reading the signal even when the signal is transferred by the source follower circuit and can sufficiently cope with the high-speed driving as well, and a method for driving the imaging apparatus.

According to an aspect of the present invention, an imaging apparatus comprises: first and second pixels each including a conversion element, a first transistor and a second transistor, wherein one of a source and a drain of the first transistor is connected to the conversion element, and the other of the source and the drain of the first transistor is connected to a gate of the second transistor, and the gate of the second transistor of the first pixel is connected to the gate of the second transistor of the second pixel; and a driving circuit connected to a gate of the first transistor of the first pixel and to a gate of the first transistor of the second pixel, wherein the driving circuit turns ON the first transistor of the first pixel and turns OFF the first transistor of the second pixel, to output a signal from the first pixel.

According to a further aspect of the present invention, an imaging system comprises the above described imaging apparatus and a signal processing unit for processing the signal output from the imaging apparatus.

According to a still further aspect of the present invention, achieved thereby is a driving method of an imaging apparatus comprising: first and second pixels each including a conversion element, a transfer transistor for transferring a signal from the conversion element and an amplifying transistor for amplifying a signal outputted from the transfer transistor, wherein a gate of the amplifying transistor of the first pixel is connected to a gate of the amplifying transistor of the second pixel, wherein the method comprising a step of turning ON the transfer transistor of the first pixel while turning OFF the transfer transistor of the second pixel, to output a signal from the first pixel.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiments of the present invention will be specifically described below with reference to the attached drawings. Incidentally, in the present application, "electro-magnetic wave" means radioactive rays having a wavelength in a wavelength region from light such as visible light and infrared light to X-rays and γ rays, as well as particulate beams such as α rays, β rays and the like.

(First Embodiment)

Figure 1:
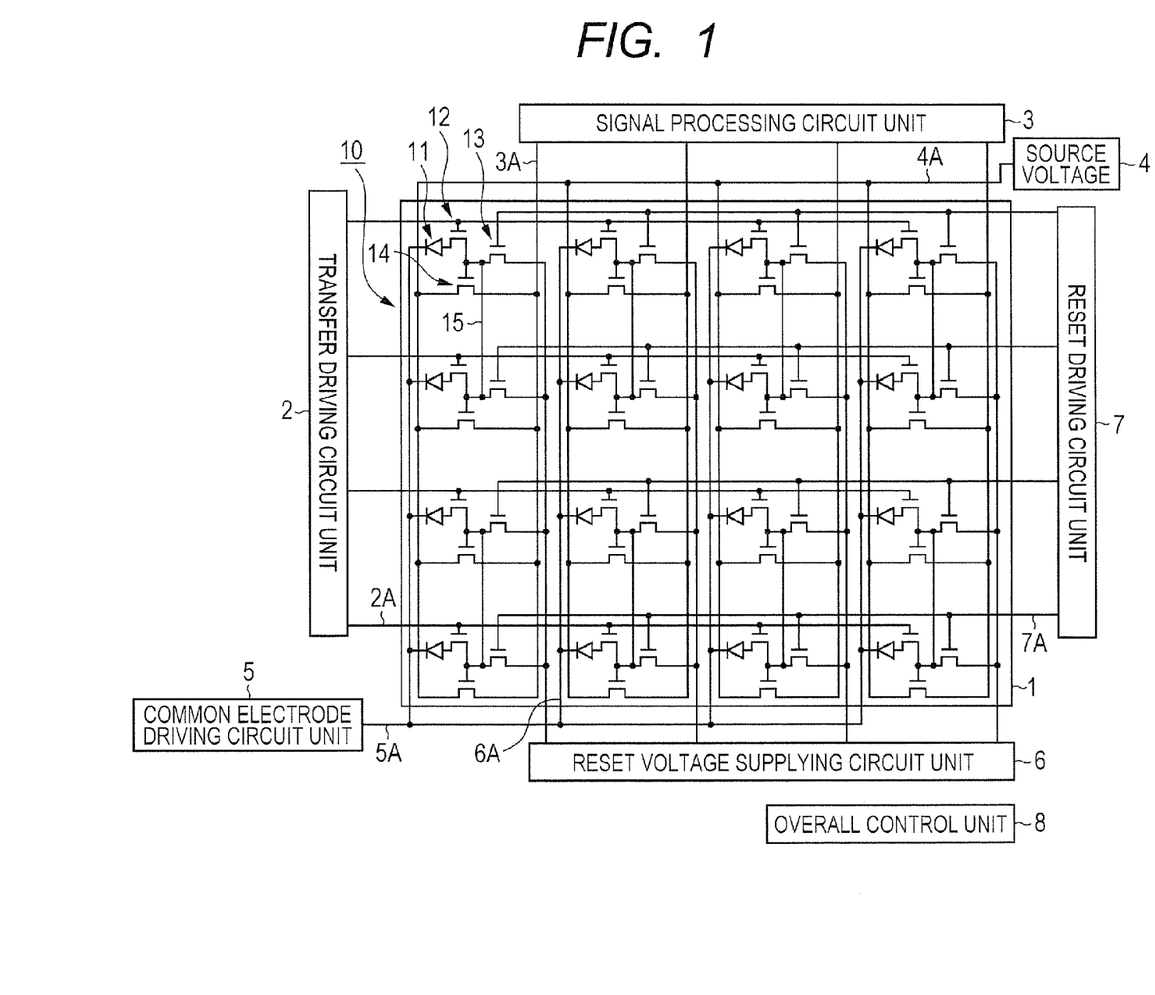
FIG. 1 is a circuit diagram illustrating a whole equivalent circuit of a radiation imaging apparatus according to a first embodiment, in a simple way.

The present embodiment discloses a radiation imaging apparatus as an imaging apparatus. FIG. 1 is a circuit diagram illustrating a whole equivalent circuit of the radiation imaging apparatus according to the present embodiment, in a simple way.

This radiation imaging apparatus may be a direct type of radiation imaging apparatus, which directly converts an electro-magnetic wave into an electrical signal, or may also be an indirect type of radiation imaging apparatus, which converts an electro-magnetic wave having a certain wavelength into an electro-magnetic wave having another wavelength once and then indirectly converts the electro-magnetic wave into the electrical signal. In the direct type of radiation imaging apparatus, a so-called wavelength conversion element (GOS, CsI or the like) becomes unnecessary, which is different from the indirect type of radiation imaging apparatus. The radiation imaging apparatus has a plurality of pixel regions 10 arranged on a glass substrate 1 in a matrix form, and includes a transfer driving circuit unit 2, a signal processing circuit unit 3, a source voltage 4, a common electrode driving circuit unit 5, a reset voltage supplying circuit unit 6, a reset driving circuit unit 7 and an overall control unit 8.

The pixel region 10 includes a photoelectric conversion element 11, a transfer thin film transistor (transfer transistor: first transistor) 12, a reset thin film transistor 13 and a source follower thin film transistor 14 (amplifying transistor: second transistor).

The transfer driving circuit unit 2 has transfer driving lines 2A each of which is connected to each gate of the transfer thin film transistors 12 in each row in each pixel region 10, which are aligned in a row direction, and drives the transfer thin film transistors 12. The signal processing circuit unit 3 has signal lines 3A each of which is connected to each source of the source follower thin film transistors 14 in each column, which are aligned in the column direction, and performs the signal processing. The source voltage 4 has source voltage supply lines 4A each of which is connected to each drain of the source follower thin film transistors 14 in each row, which are aligned in the row direction, and supplies a drain voltage to the thin film transistors. The common electrode driving circuit unit 5 has common electrode lines 5A each of which is connected to each of photoelectric conversion elements 11 in each column, which are aligned in the column direction, and drives the photoelectric conversion elements 11. The reset voltage supplying circuit unit 6 has reset potential supply lines 6A each of which is connected to the reset thin film transistors 13 in each column, which are aligned in the column direction, and drives the reset thin film transistors 13. The reset driving circuit unit 7 has reset driving lines 7A each of which is connected to each gate of the reset thin film transistors 13 in each row, which are aligned in the row direction, and drives the reset thin film transistors 13.

The overall control unit 8 includes a central processing circuit (CPU), ROM and RAM. The overall control unit 8 is connected to each of the transfer driving circuit unit 2, the signal processing circuit unit 3, the source voltage 4, the common electrode driving circuit unit 5, the reset voltage supplying circuit unit 6 and the reset driving circuit unit 7, and controls the driving of the units. Incidentally, FIG. 1 omits the illustration of connection wires between the overall control unit 8 and each of the transfer driving circuit unit 2 to the reset driving circuit unit 7, for convenience in illustration.

The photoelectric conversion element 11 may be a so-called MIS type formed of a metal/insulating film/semiconductor, or may also be a so-called PIN type formed of a p-type semiconductor/semiconductor/n-type semiconductor. Each of the transfer thin film transistor 12, the reset thin film transistor 13 and the source follower thin film transistor 14 may be a transistor using polysilicon, or may also be formed of amorphous silicon. In addition, the form of each of the thin film transistors may be a bottom gate type, or may also be a top gate type.

As for the pixel region 10, FIG. 1 illustrates only a matrix of 4 pixels×4 pixels, but the number of the pixel regions 10 is arbitrary. In the present embodiment, the gates of the source follower thin film transistors 14 in two adjacent pixel regions 10 in parallel with a signal line 3A are connected by a source follower connection line 15. In the figure, the gates of the source follower thin film transistors 14 are connected (shorted) with each other only in two adjacent pixel regions 10, but the gates of the source follower thin film transistor 14 may be connected with each other also in three or more pixel regions 10.

Figure 2:
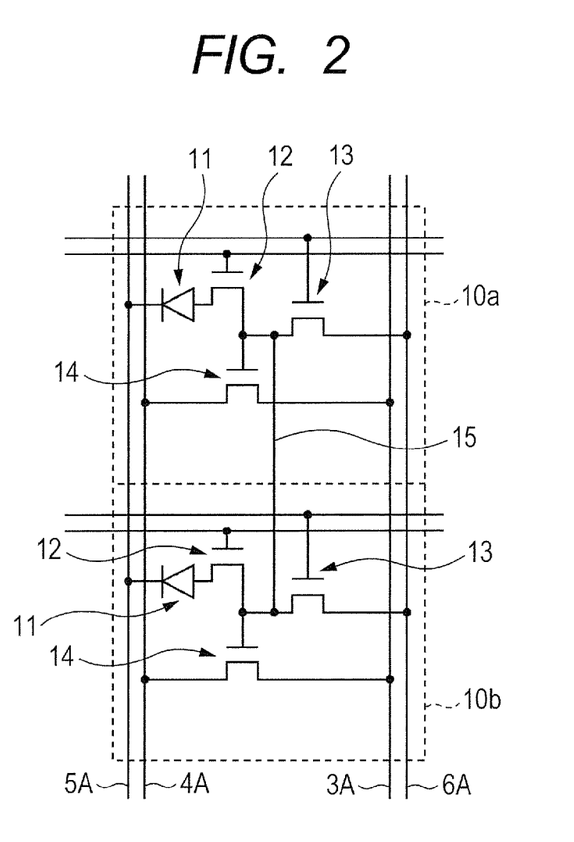
FIG. 2 is a magnified circuit diagram illustrating two adjacent pixel regions in the radiation imaging apparatus according to the first embodiment.

FIG. 2 is a magnified circuit diagram illustrating two adjacent pixel regions in the radiation imaging apparatus according to the present embodiment. Here, the respective pixel regions shall be represented by pixel regions 10a and 10b (first pixel and second pixel). In each of the pixel regions 10a and 10b, one of the source and the drain of the transfer thin film transistor 12 is connected to the photoelectric conversion element 11a, and the other is connected to the gate of the source follower thin film transistor 14. Furthermore, one of the source and the drain of the reset thin film transistor 13 is connected to the other and the gate of the source follower thin film transistor 14. The gate of the source follower thin film transistor 14 in the pixel region 10a and the gate of the source follower thin film transistor 14 in the pixel region 10b are connected to each other by the source follower connection line 15, between the adjacent pixel regions 10a and 10b.

The radiation imaging apparatus according to the present embodiment turns the transfer thin film transistor 12 in the pixel region 10a on when reading a signal, and turns the transfer thin film transistor 12 in the pixel region 10b off to output the signal of the pixel region 10a. Specifically, when the apparatus reads the signal, the overall control unit 8 controls the transfer driving circuit unit 2 to turn the transfer thin film transistor 12 in the pixel region 10a on and also to turn the transfer thin film transistor 12 in the pixel region 10b off. Thereby, electric charges which have been accumulated in the photoelectric conversion element 11 in the pixel region 10a are transferred to the gate of each of the source follower thin film transistors 14 in the pixel regions 10a and 10b. Then, the electric charges which have been amplified by the two source follower thin film transistors 14 are transferred to the signal processing circuit unit 3 through the source voltage supply line 4A and the signal line 3A, and the signal is read.

The radiation imaging apparatus usually has a rectangular shape with its one side of approximately 20 cm to 45 cm (for instance, approximately 40 cm×40 cm), and accordingly the length of the signal line 3A is also approximately 20 cm to 45 cm. In this case, the parasitic capacitance of the signal line of the signal processing circuit unit becomes approximately 50 pF to 300 pF. In addition, the electrical resistance of the thin film transistor to be used as the source follower thin film transistor usually becomes 10 kΩ to 100 kΩ, when the transistor is prepared from polysilicon, and becomes approximately 1 MΩ to 10 MΩ when the transistor is prepared from amorphous silicon. A transfer time constant is expressed by a product of the resistance value of the source follower thin film transistor and the resistance value of the signal line, and becomes such an extremely large value as approximately 1μ second to 500μ seconds, in the above described case. It is difficult to realize driving for a moving image by a transfer speed corresponding to the transfer time constant. In order to achieve the enhancement of the transfer speed, there is no other way except to lower the resistance of the source follower thin film transistor or lower the parasitic capacitance of the signal line. It is equivalent to reducing the size of the radiation imaging apparatus to largely decrease the parasitic capacitance of the signal line, and is impossible. Accordingly, the resistance of the source follower thin film transistor should be decreased.

For this purpose, the electric charges may be transferred by using a plurality of the source follower thin film transistors. In the present embodiment, as in FIG. 2, the electric charges are transferred with the use of the two source follower thin film transistors 14 in the adjacent pixel regions 10a and 10b. In this case, the use of two source follower thin film transistors is substantially equivalent to an operation of doubling the channel width (gate width) of a transistor which is the source follower thin film transistor, and the resistance value is reduced to the half. In other words, the time constant becomes a half of the value. When the three source follower thin film transistors are used, the time constant becomes ⅓ of the value, and when N pieces of the source follower thin film transistors are used, the time constant becomes 1/N of the value.

If an object is only to decrease the resistance value of the source follower thin film transistor, the source follower thin film transistor having an extremely large channel width may be prepared by devising the layout. However, it is known that when the source follower thin film transistor is prepared from polysilicon having a large channel width, the characteristics deteriorate due to the generated heat. In the transistor having the large channel width, a place is lost from which heat is released, and the heat tends to be accumulated. The radiation imaging apparatus according to the present embodiment uses plural pieces of the source follower thin film transistors and considers heat diffusion, and thereby suppresses the deterioration of the characteristics and realizes a great improvement of the transfer time constant.

Figure 3:
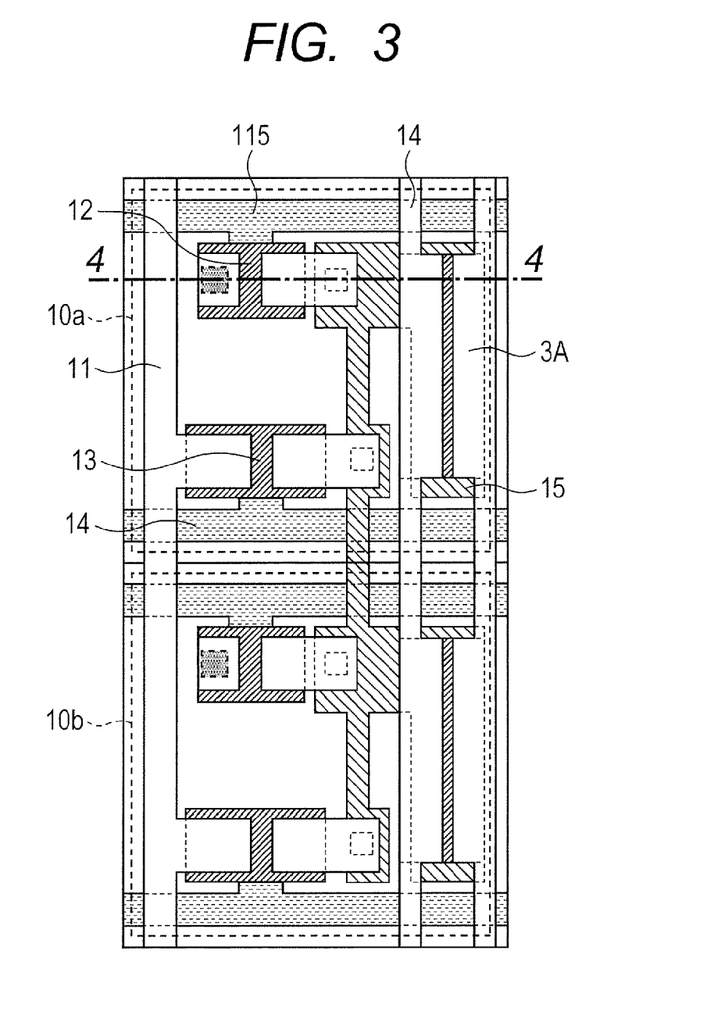
FIG. 3 is a schematic plan view illustrating the layout of FIG. 2.

FIG. 3 is a schematic plan view illustrating the layout of FIG. 2. In FIG. 3, each semiconductor portion of the transfer thin film transistor 12, the reset thin film transistor 13 and the source follower thin film transistor 14 is formed from, for instance, amorphous silicon. The polysilicon may be used in place of the amorphous silicon. These thin film transistors are illustrated by an example having a bottom gate type structure as has been described above, but may adopt a top gate type structure.

The transfer thin film transistor 12, the reset thin film transistor 13 and the source follower thin film transistor 14 are arranged within one pixel region 10. In addition, the source follower connection line 15 connects gates of the source follower thin film transistors 14 of the two adjacent pixel regions 10 to each other. Thereby, the radiation imaging apparatus can use two source follower thin film transistors 14, when reading the electric charges which have been accumulated in the pixel region 10.

Figure 4:
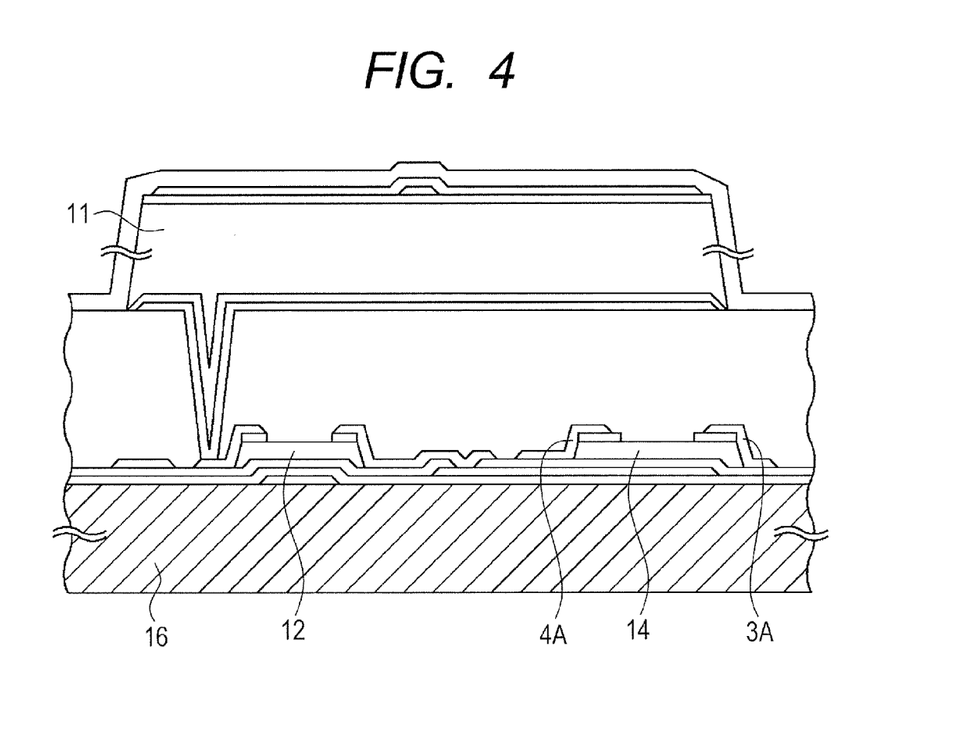
FIG. 4 is a schematic sectional view taken along a line 4-4 of FIG. 3.

FIG. 4 is a schematic sectional view along a line 4-4 in FIG. 3. The radiation imaging apparatus constitutes a stacked structure in which an insulation substrate such as a glass substrate 1, each of the thin film transistors 12, 13 and 14 and the photoelectric conversion element 11 are stacked from the bottom. Particularly, the gate of the transfer thin film transistor 12 and the gate of the source follower thin film transistor 14 cannot be formed to be the same layer, because the gates have such characteristics as to be extended over the pixel regions. For this reason, a film-forming process for each of the above described gates needs to be performed in twice through an insulation layer 16 such as SiN.

Figure 5:
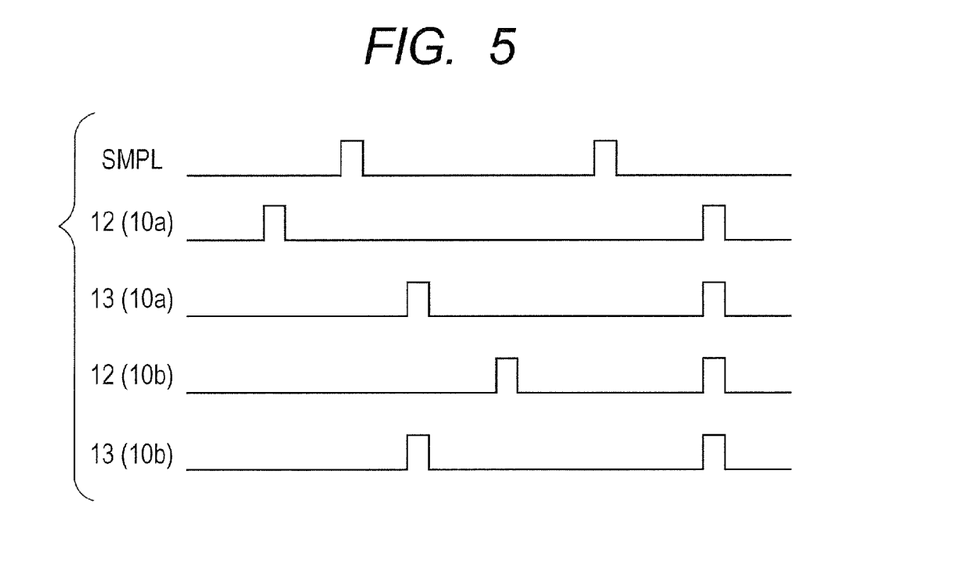
FIG. 5 is a view illustrating a timing chart during an actual driving period in the radiation imaging apparatus according to the first embodiment.

FIG. 5 is a view illustrating a timing chart during an actual driving period in the radiation imaging apparatus according to the present embodiment. In regard to the two pixel regions 10a and 10b in FIG. 2, the electric charges which have been accumulated in the photoelectric conversion element 11 in the pixel region 10a are read in the following method. The transfer thin film transistor 12 in the pixel region 10b is turned off, the transfer thin film transistor 12 in the pixel region 10a is turned on, and the signal is sampled by the signal processing circuit unit 3. Subsequently, each of the reset thin film transistors 13 in the pixel regions 10a and 10b is turned on, and each gate of the source follower thin film transistors 14 is reset to a reset potential.

Subsequently, in order to read the signal of the pixel region 10b, the transfer thin film transistor 12 in the pixel region 10a is turned off, the transfer thin film transistor 12 in the pixel region 10b is turned on, and the signal is sampled by the signal processing circuit unit 3. Subsequently, each of the reset thin film transistors 13 in the pixel regions 10a and 10b is turned on, and each gate of the source follower thin film transistors 14 in the pixel regions 10a and 10b is reset to the reset potential. At this time, each of the transfer thin film transistors 12 in the pixel regions 10a and 10b is turned on, and each of the photoelectric conversion elements 11 in the pixel regions 10a and 10b is reset to the reset potential. This timing chart is applied to each of the pixel regions 10, which is determined to be a block by the source follower connection line, and the signal is read.

As has been described above, the present embodiment realizes a highly reliable radiation imaging apparatus which shows an enhanced signal transfer speed even when the signal is transferred through a circuit using the source follower circuit and which can sufficiently cope with the high-speed driving as well, and a method for driving the same.

(Second Embodiment)

Figure 6:
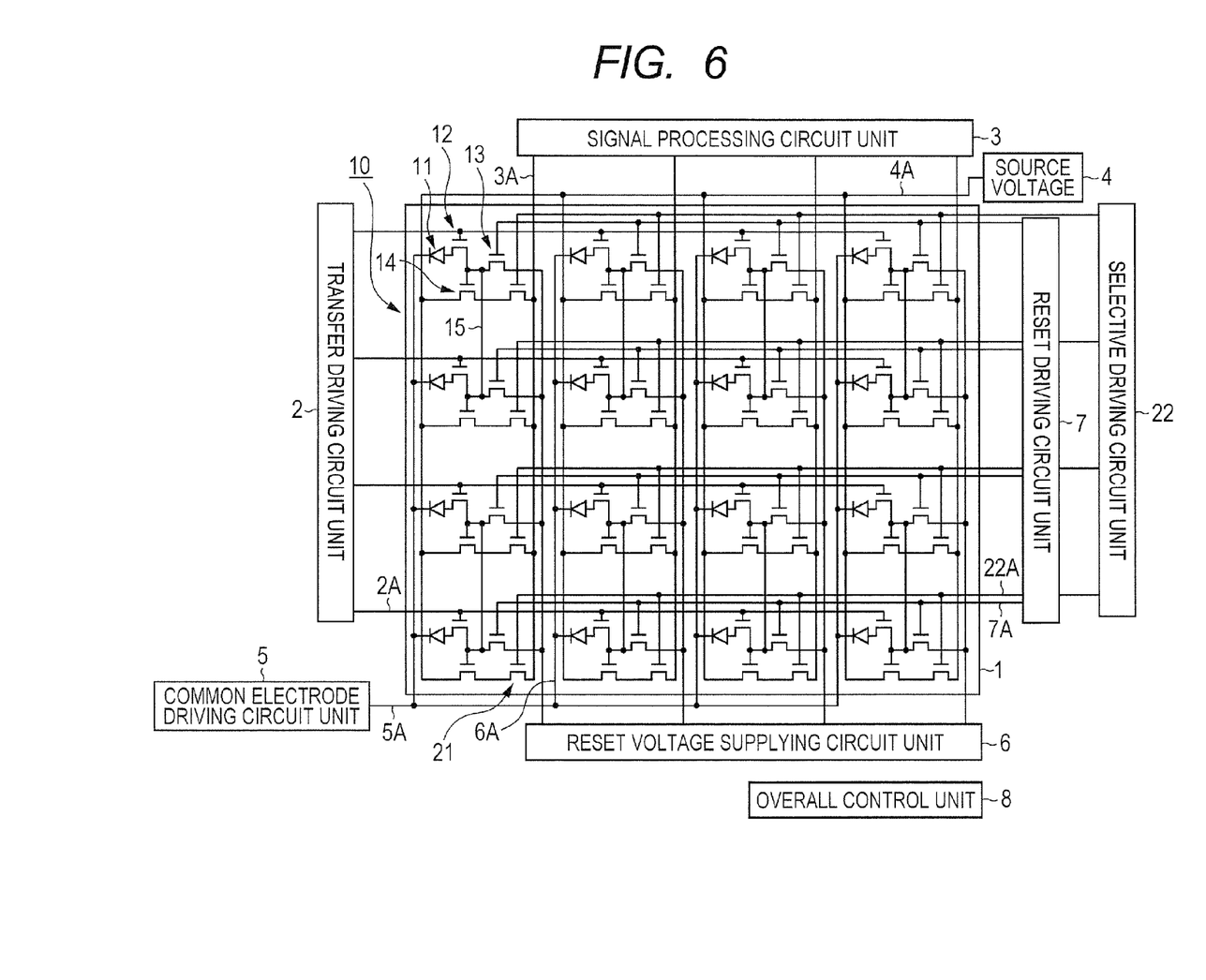
FIG. 6 is a circuit diagram illustrating a whole equivalent circuit of a radiation imaging apparatus according to a second embodiment, in a simple way.
Figure 7:
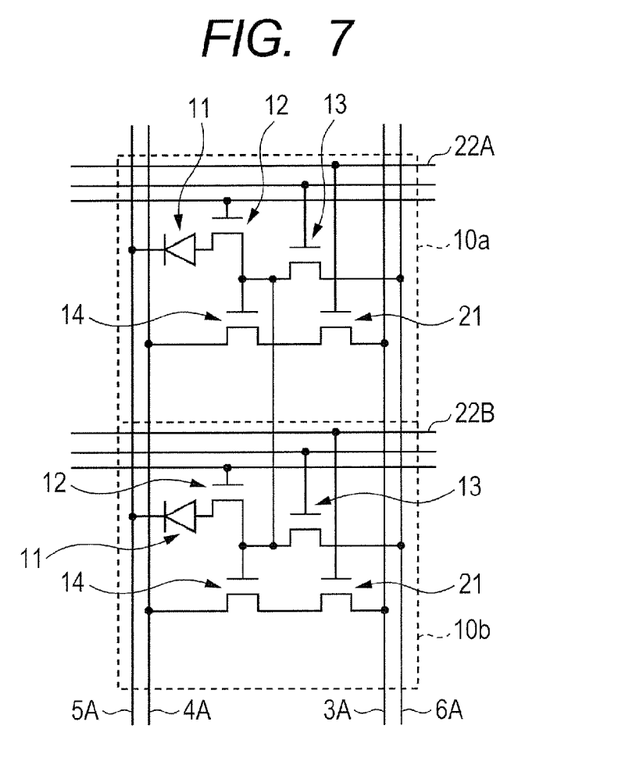
FIG. 7 is a magnified circuit diagram illustrating two adjacent pixel regions in the radiation imaging apparatus according to the second embodiment.

The present embodiment discloses a radiation imaging apparatus as an imaging apparatus. The component members and the like similar to those in the first embodiment will be denoted by the same reference numerals, and the detailed description will be omitted. FIG. 6 is a circuit diagram illustrating a whole equivalent circuit of a radiation imaging apparatus according to the present embodiment, in a simple way. FIG. 7 is a magnified circuit diagram illustrating two adjacent pixel regions in the radiation imaging apparatus according to the present embodiment.

In this radiation imaging apparatus, a selection thin film transistor (third transistor) 21 and a selective driving circuit unit 22 are added to the equivalent circuit of the radiation imaging apparatus according to the first embodiment illustrated in FIG. 1. The selection thin film transistor 21 is connected between the source or the drain of the source follower thin film transistor 14 and the signal line 3A, in each of the pixel regions 10. The selective driving circuit unit 22 is a unit for driving the selection thin film transistors 21, and is connected to the selection thin film transistors 21 by the selection driving line 22A. The selective driving circuit unit 22 is connected to the overall control unit 8, and the driving is controlled by the overall control unit 8.

The selection thin film transistor 21 can more arbitrarily set a driving timing, and furthermore has a function of intercepting a leakage current which flows into the signal line 3A from the source follower thin film transistor 14. Thereby, the information which has been obtained in the pixel region 10 can be more accurately transferred to the signal processing circuit unit 3.

Figure 8:
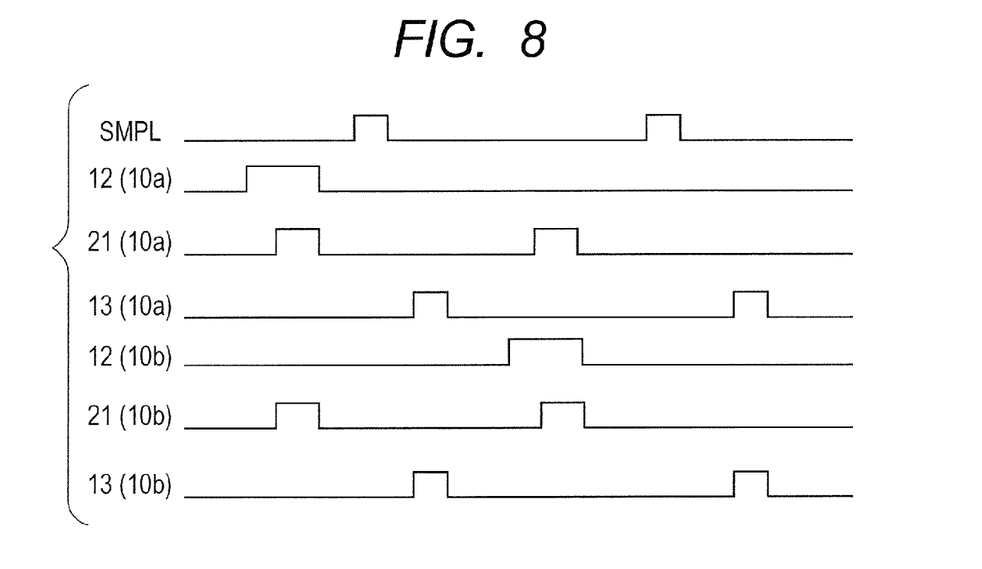
FIG. 8 is a view illustrating a timing chart during an actual driving period in the radiation imaging apparatus according to the second embodiment.

FIG. 8 is a view illustrating a timing chart during an actual driving period in the radiation imaging apparatus according to the present embodiment. In regard to the two pixel regions 10a and 10b in FIG. 7, the electric charges which have been accumulated in the photoelectric conversion element 11 in the pixel region 10*a* are read in the following method. The transfer thin film transistor 12 in the pixel region 10*b* is turned off, the transfer thin film transistor 12 in the pixel region 10*a* is turned on, and signals are sampled by the signal processing circuit unit 3. At this time, electric charges are transferred to the gate of each of the source follower thin film transistors 14 in the pixel regions 10*a* and 10*b*, from the photoelectric conversion element 11 in the pixel region 10*a*. The transfer needs a period of time corresponding to a time constant which is determined by a product of the capacitance of the photoelectric conversion element 11 and the resistance value of the transfer thin film transistor 12. After a period of time equivalent to several times of the time constant has passed, each of the selection thin film transistors 21 in the pixel regions 10*a* and 10*b* is turned on, and the electric charges are transferred with the use of each of the source follower thin film transistors 14 in the pixel regions 10*a* and 10*b*. After that, each of the reset thin film transistors 13 in the pixel regions 10*a* and 10*b* is turned on, and each gate of the source follower thin film transistors 14 is reset to a reset potential.

Subsequently, in order to read the signal of the pixel region 10*b*, the transfer thin film transistor 12 in the pixel region 10*a* is turned off, the transfer thin film transistor 12 in the pixel region 10*b* is turned on, and the signal is sampled by the signal processing circuit unit 3. After a period of time equivalent to several times of the time constant which is determined by a product of the capacitance of the photoelectric conversion element 11 and the resistance value of the transfer thin film transistor 12 has passed, each of the selection thin film transistors 21 in the pixel regions 10*a* and 10*b* is turned on, and the electric charges which are supplied from the source voltage 4 are transferred. Each of the reset thin film transistors 13 in the pixel regions 10*a* and 10*b* is turned on, each of the transfer thin film transistors 12 in the pixel regions 10*a* and 10*b* is turned on, and each of the photoelectric conversion elements 11 and the gate of each of the source follower thin film transistors 14 are reset to the reset potential. This timing chart is applied to each of the pixel regions 10, which is determined to be a block by the source follower connection line, and the signal is read.

As has been described above, the present embodiment realizes a highly reliable radiation imaging apparatus which shows an enhanced signal transfer speed even when the signal is transferred through a circuit using the source follower circuit, can sufficiently cope with the high-speed driving as well and realizes more accurate signal transfer, and a method for driving the same.

(Third Embodiment)

The present embodiment discloses a radiation imaging apparatus as an imaging apparatus. The component members and the like similar to those in the first and second embodiments will be denoted by the same reference numerals, and the detailed description will be omitted.

Figure 9:
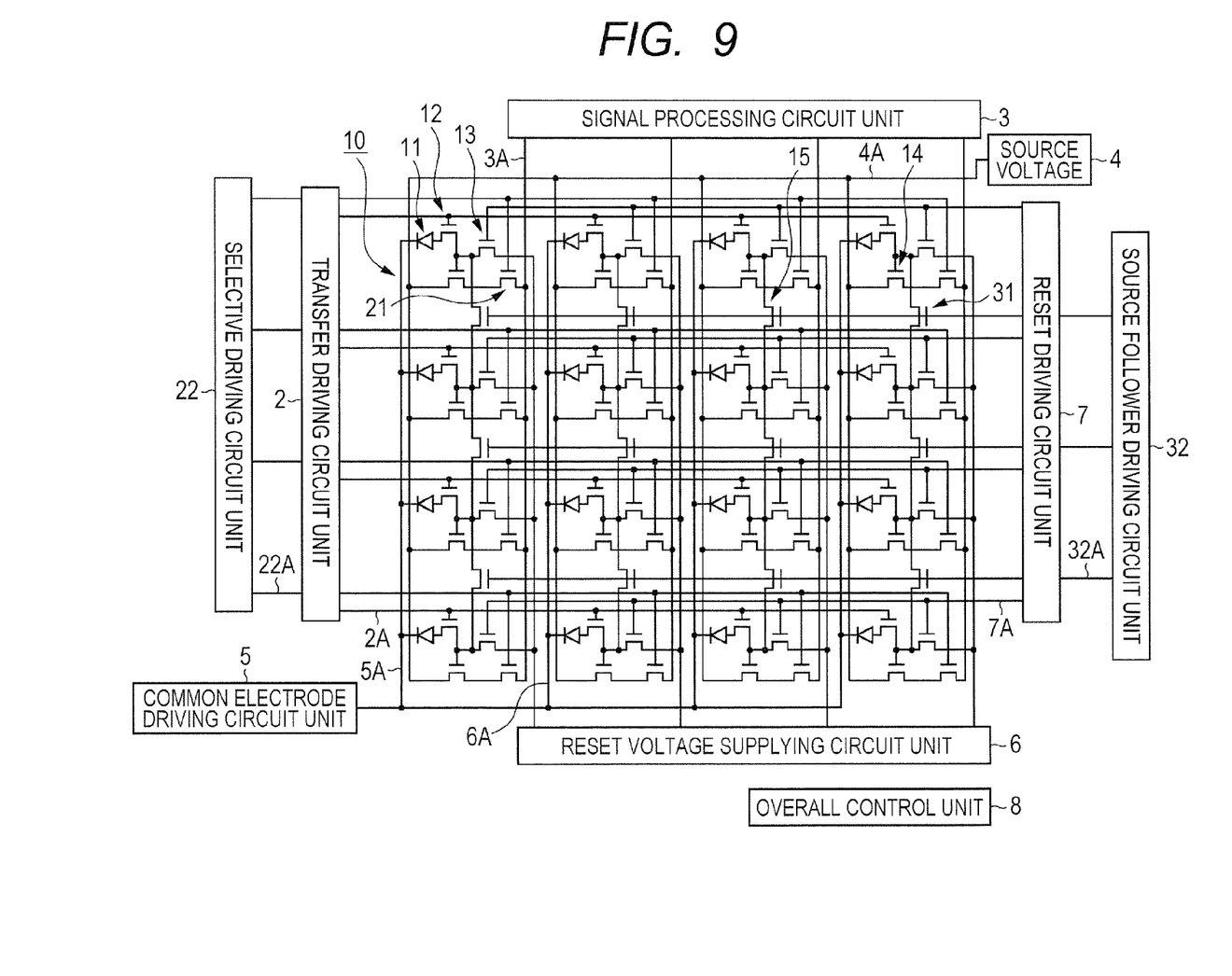
FIG. 9 is a circuit diagram illustrating a whole equivalent circuit of a radiation imaging apparatus according to a third embodiment, in a simple way.
Figure 10:
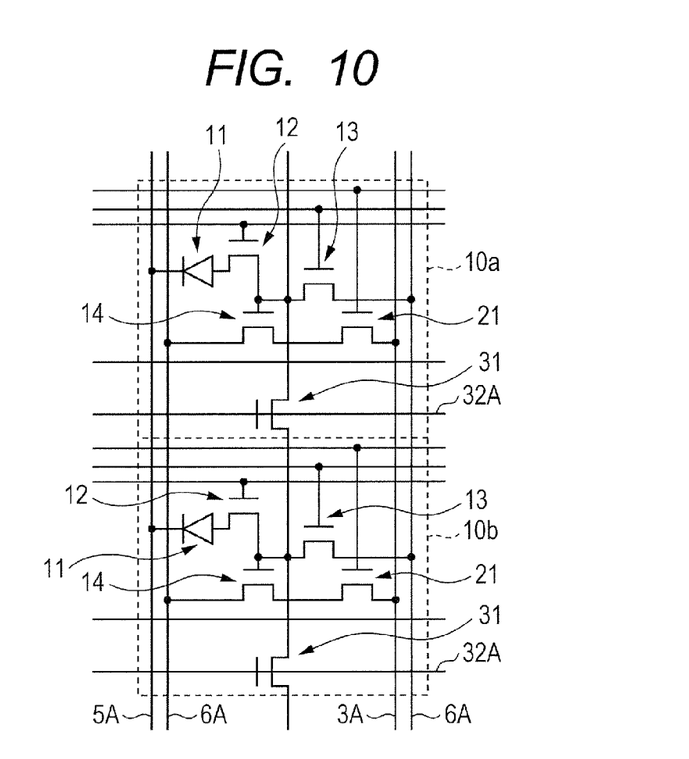
FIG. 10 is a magnified circuit diagram illustrating two adjacent pixel regions in the radiation imaging apparatus according to the third embodiment.

FIG. 9 is a circuit diagram illustrating a whole equivalent circuit of a radiation imaging apparatus according to the present embodiment, in a simple way. FIG. 10 is a magnified circuit diagram illustrating two adjacent pixel regions in the radiation imaging apparatus according to the present embodiment.

In this radiation imaging apparatus, a source follower connection thin film transistor (fourth transistor) 31 and a source follower connection driving circuit unit 32 are added to the equivalent circuit of the radiation imaging apparatus according to the second embodiment illustrated in FIG. 6. The source follower connection thin film transistor 31 is connected to the source follower connection line 15, in each of the pixel regions 10. The source follower connection driving circuit unit 32 is connected to the source follower connection thin film transistors 31 by the connection driving line 32A. The source follower connection driving circuit unit 32 is connected to the overall control unit 8, and the driving is controlled by the overall control unit 8.

The source follower connection thin film transistor 31 changes the number of the source follower thin film transistors to be used for signal transfer, and can arbitrarily change the transfer time constant. In addition, also when the pixels of a plurality of lines are simultaneously read (pixel addition), the number can be arbitrarily determined.

Figure 11:
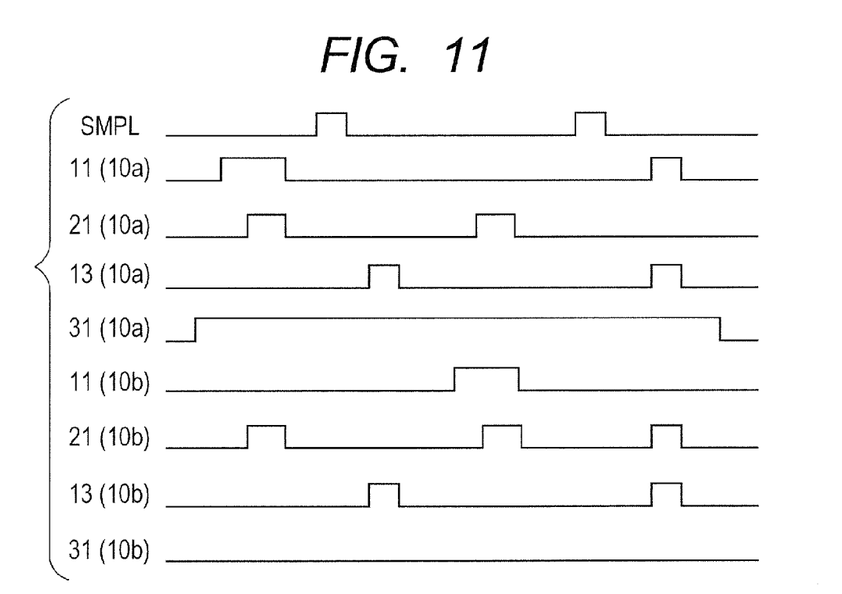
FIG. 11 is a view illustrating a timing chart during an actual driving period in the radiation imaging apparatus according to the third embodiment.

FIG. 11 is a view illustrating a timing chart during an actual driving period in the radiation imaging apparatus according to the present embodiment. Here, the chart is illustrated for such a case that two pieces of the source follower thin film transistors 14 are used for the transfer of the electric charges. In regard to the two pixel regions 10*a* and 10*b* in FIG. 10, the source follower connection thin film transistor 31 in the pixel region 10*a* is turned on. In order to read the electric charges which have been accumulated in the photoelectric conversion element 11 in the pixel region 10*a*, the transfer thin film transistor 12 in the pixel region 10*b* is turned off, the transfer thin film transistor 12 in the pixel region 10*a* is turned on, and the signals are sampled by the signal processing circuit unit 3. Each of the reset thin film transistors 13 in the pixel regions 10*a* and 10*b* is turned on, and the gate of each of the source follower thin film transistors 14 is set at the reset potential.

Subsequently, the signal of the pixel region 10*b* is read in the following method. In a state in which the source follower connection thin film transistor 31 in the pixel region 10*a* is turned on, the transfer thin film transistor 12 in the pixel region 10*a* is turned off, the transfer thin film transistor 12 in the pixel region 10*b* is turned on, and the signal is sampled by the signal processing circuit unit 3. Each of the reset thin film transistors 13 in the pixel regions 10*a* and 10*b* is turned on, and each of the transfer thin film transistors 12 in the pixel regions 10*a* and 10*b* is turned on. Each of the photoelectric conversion elements 11 and the gate of each of the source follower thin film transistors 14 are reset to the reset potential. The source follower connection thin film transistor 31 in the pixel region 10*a* is turned off.

Incidentally, a timing chart of FIG. 11 illustrates the case corresponding to the time when the two source follower thin film transistors 14 are used for electric charge transfer. Here, even such a case is in the scope of the present embodiment that a predetermined number which is three or more of source follower thin film transistors 14 are used for the electric charge transfer.

In the present embodiment, an arbitrary number of pixels also can be added by adjusting the number of the source follower connection thin film transistors 31 to be turned on. In this case, the source follower connection thin film transistor may be controlled in the timing chart so that the transfer thin film transistors 12 corresponding to the pixels which are desired to be added are simultaneously turned on, in FIG. 11.

As has been described above, the present embodiment shows an enhanced signal transfer speed even when the signal is transferred through a circuit using the source follower circuit, and can sufficiently cope with the high-speed driving as well. Thereby, the present embodiment realizes a highly reliable radiation imaging apparatus which can arbitrarily change the transfer time constant and also can add the arbitrary number of pixels, and a method for driving the same.

(Fourth Embodiment)

Figure 12:
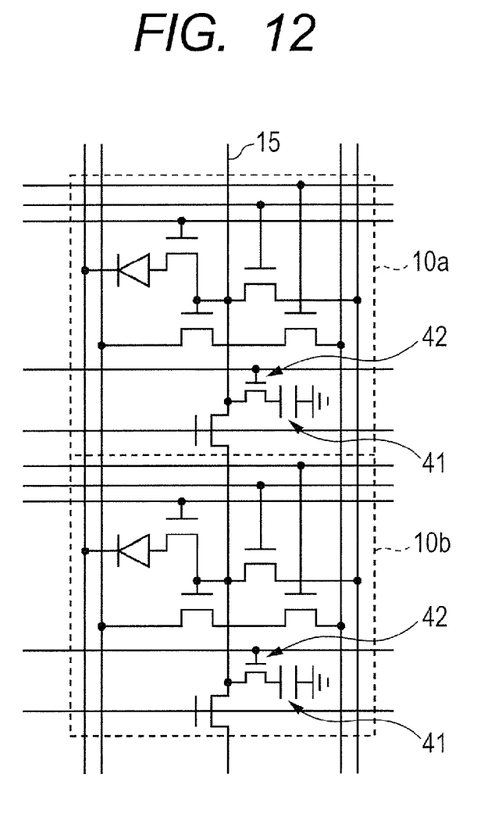
FIG. 12 is a magnified circuit diagram illustrating two adjacent pixel regions in the radiation imaging apparatus according to a fourth embodiment.

The present embodiment discloses a radiation imaging apparatus as an imaging apparatus. The component members and the like similar to those in the first, second and third embodiments will be denoted by the same reference numerals, and the detailed description will be omitted. FIG. 12 is a magnified circuit diagram illustrating two adjacent pixel regions in the radiation imaging apparatus according to the present embodiment.

In this radiation imaging apparatus, a capacitor 41 and a switching transistor (fifth transistor) 42 are added to the equivalent circuit of the radiation imaging apparatus according to the third embodiment illustrated in FIG. 9. The capacitor 41 is a device for adjusting a dynamic range. The switching transistor 42 is a device for switching whether the capacitor 41 is used or not (on/off).

The switching transistor 42 has its gate connected to a connection driving line and has one of its source and drain connected to a source follower connection line 15. The capacitor 41 is connected to the other of the source and the drain of the switching transistor 42.

When the radiation imaging apparatus is used, the dosage of radioactive rays to be used then is different between the time when a moving image is taken and the time when a still image is taken. Generally, the radiological dosage is high when the still image is taken, and is low when the moving image is taken. In the case of the radiation imaging apparatus which does not use a source follower thin film transistor, the dynamic range of an amplifier IC existing in a signal processing circuit unit may be designed in consideration of only the difference between the radiological dosages in the moving image mode and in the still image mode. However, in the case of the radiation imaging apparatus which uses the source follower thin film transistor when reading the signal as in the present embodiment, the signal is amplified, and accordingly the difference between the quantities of read signals when the moving image has been taken and when the still image has been taken results in also being amplified. Accordingly, when the source follower thin film transistor is used, the dynamic range of the amplifier IC needs to be set at a large value. However, this method results in depending on only the performance of the amplifier IC, and places a heavy load to the design of the amplifier IC. Then, in the present embodiment, the capacitor 41 for switching the dynamic range is arranged in the source follower connection line 15 in the third embodiment, and the switching transistor 42 is further arranged which can select whether the capacitor 41 is used or not. The capacitor 41 may also be formed so as to overlap with the gate of the switching transistor 42.

For instance, the radiological dosage is high when the still image is taken, accordingly the voltage applied to the source follower thin film transistor 14 can be lowered by using the capacitor 41, and the quantity of the electric charges to be transferred to the signal line 3A can be decreased. In addition, the radiological dosage is set at a low value when the moving image is taken, and accordingly the loss of the quantity of the electric charges to be transferred to the signal line 3A is suppressed by using no capacitor 41 or using only a predetermined number of the capacitors 41 out of the plurality of the capacitors. These effects enable the dynamic range to be switched within the pixel region 10, and enable the image to be surely taken in the moving image mode and in the still image mode even when the source follower thin film transistor 14 is employed, without placing a load on the amplifier IC.

As has been described above, the present embodiment shows an enhanced signal transfer speed even when the signal is transferred through a circuit using the source follower circuit, and can sufficiently cope with the high-speed driving as well. Thereby, the present embodiment realizes a highly reliable radiation imaging apparatus which can take desired images in a moving image mode and in a still image mode, and a method for driving the same.

Incidentally, the functions of each component (overall control unit 8 and the like) constituting the radiation imaging apparatus according to the above described embodiments can be achieved when a program stored in the RAM, the ROM or the like of the computer built in the radiation imaging apparatus works. The present invention includes this program, and a storage medium which has the program recorded therein and can be read by a computer, as well.

Specifically, the above described program is provided to a computer through a recording medium, for instance, such as a CD-ROM, or through other various transfer media, in which the program has been recorded. A hard disk, a magnetic tape, a magneto-optical disk, a nonvolatile memory card, a memory stick and the like in addition to the CD-ROM can be used as the recording medium for recording the program therein. On the other hand, a communication medium in a computer network system for propagating and supplying the program information as a carrier wave can be used as the transmission medium of the program. Here, the computer network means LAN, WAN such as the Internet, a wireless communication network and the like, and the communication medium means a wire line such as an optical fiber, a wireless line and the like.

In addition, the program included in the present invention is not limited to only such a program as to achieve the functions of the above described embodiments when the supplied program is executed by the computer. For instance, even when the functions of the above described embodiments are achieved in cooperation with an OS (operating system) by which the program operates in the computer, or another application software or the like, the program used in the above is included in the present invention. In addition, also when all or a part of the processes of the supplied program are executed by a function extension board or a function extension unit of the computer and the functions of the above described embodiments are achieved, the program used in the above is also included in the present invention.

(Fifth Embodiment)

Figure 13:
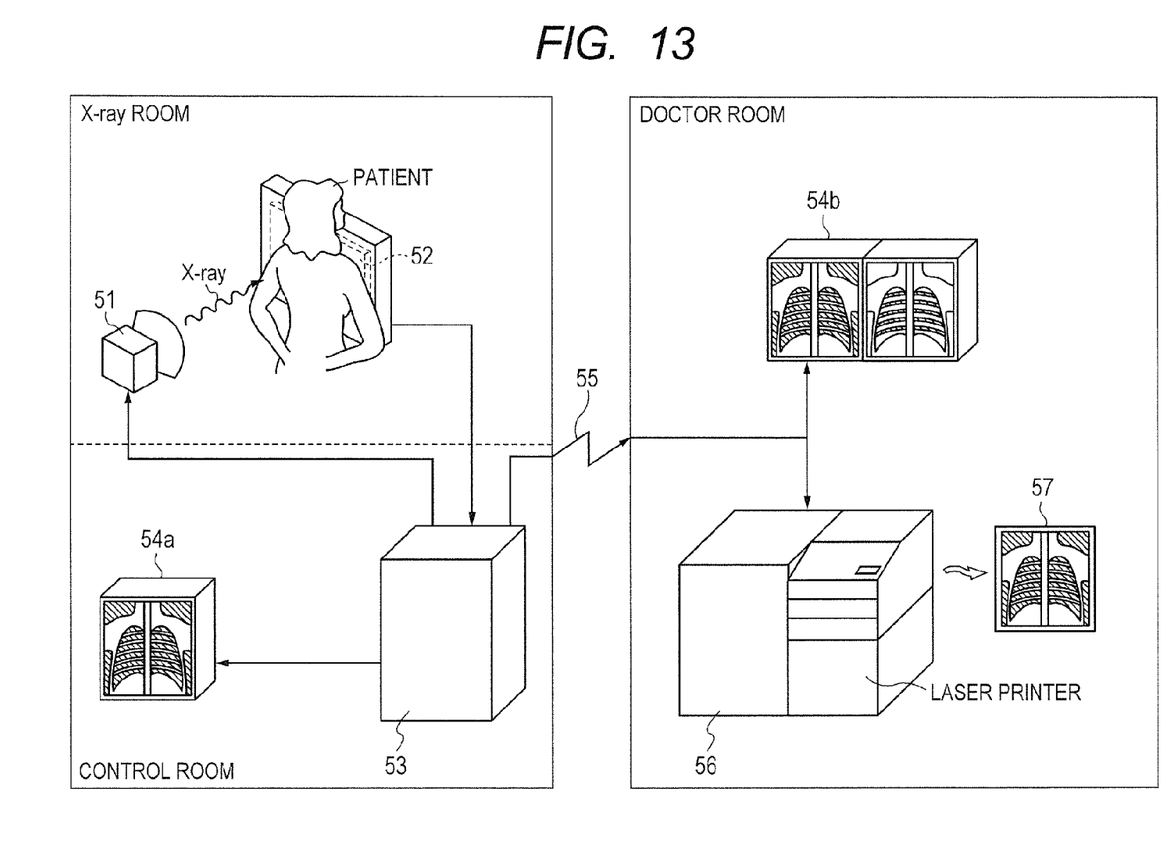
FIG. 13 is a schematic view illustrating a schematic configuration of an X-ray diagnosis system according to a fifth embodiment.

The present embodiment discloses an X-ray diagnosis system as a radiation imaging system provided with one type of a radiation imaging apparatus selected from first to fourth embodiments. FIG. 13 is a schematic view illustrating a schematic configuration of an X-ray diagnosis system according to the present embodiment.

This X-ray diagnosis system includes an X-ray tube 51, a photoelectric conversion apparatus 52, an image processor 53, displays 54a and 54b, a telephone line 55 and a film processor 56. The X-ray tube 51 is a radiation source for generating an electro-magnetic wave which is X-rays here. The photoelectric conversion apparatus 52 has a scintillator mounted on its upper part, and is one type of a radiation imaging apparatus selected from the first to fourth embodiments. The image processor 53 is a signal processing unit for digitizing a signal which has been output from the photoelectric conversion apparatus 52. The displays 54a and 54b are display units for displaying signals which have been output from the image processor 53. The telephone line 55 is a transfer processing unit for transferring the signals which have been output from the image processor 53 to a remote place such as a doctor room that is another place. The film processor 56 is a recording unit for recording the signals which have been output from the image processor 53.

When this X-ray diagnosis system is used, X-rays which have been generated in the X-ray tube 51 are transmitted through the chest of a patient (subject), and are incident on the photoelectric conversion apparatus 52 which has the scintillator mounted on its upper part. Here, the photoelectric conversion apparatus 52 having the scintillator mounted on its upper part constitutes one type of a radiation imaging apparatus selected from the first to fourth embodiments. These incident X-rays include the information about the inside of the body of the patient. The scintillator emits light in response to the incident X-rays, and the photoelectric conversion apparatus converts the light to an electric signal to obtain electric information. This information is converted into digital signals, the signals are processed into an image by the image processor 53 which becomes a signal processing unit, and the image can be observed through the display 54a which becomes a display unit of a control room.

In addition, this information can be transferred to a remote place through a transfer processing unit such as the telephone line 55, can be displayed on the display 54b which becomes a display unit in the doctor room or the like that is another place, or can be stored in a recording unit such as an optical disk. Based on the information, a doctor in the remote place can also diagnose the disease. In addition, the information can be also recorded on a film 57 which becomes a recording medium, by the film processor 56 that becomes a recording unit.

As has been described above, the present embodiment realizes a highly reliable X-ray diagnosis system which shows an enhanced signal transfer speed even when the signal is transferred through a circuit using the source follower circuit, can sufficiently cope with the high-speed driving as well, and can take desired images in a moving image mode and a still image mode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-279751, filed Dec. 21, 2011, which is hereby incorporated by reference herein in its entirety.

What is claimed is:

1. An imaging apparatus comprising:
   first and second pixels each including a conversion element, a first transistor and a second transistor, wherein one of a source and a drain of the first transistor is connected to the conversion element, and the other of the source and the drain of the first transistor is connected to a gate of the second transistor, and the gate of the second transistor of the first pixel is connected to the gate of the second transistor of the second pixel; and
   a driving circuit connected to a gate of the first transistor of the first pixel and to a gate of the first transistor of the second pixel, wherein
   the driving circuit turns ON the first transistor of the first pixel and turns OFF the first transistor of the second pixel, to output a signal from the first pixel.

2. The imaging apparatus according to claim 1, wherein
   each of the first and second pixels includes a third transistor having a source and a drain one of which is connected to the one of a source and a drain of the second transistor and outputting a signal amplified by the second transistor to a signal line,
   the imaging apparatus comprises a further driving circuit connected to a gate of the third transistor of the first pixel and to a gate of the third transistor of the second pixel, and,
   after the driving circuit turns ON the first transistor of the first pixel and turns OFF the first transistor of the second pixel,
   the further driving circuit turns ON the third transistors of the first and second pixels, to output the signal from the first pixel.

3. The imaging apparatus according to claim 1, further comprising
   a fourth transistor arranged between the gate of the second transistor of the first pixel and the gate of the second transistor of the second pixel.

4. The imaging apparatus according to claim 1, further comprising
   a capacitor arranged between the gate of the second transistor of the first pixel and the gate of the second transistor of the second pixel, for adjusting a dynamic range.

5. The imaging apparatus according to claim 4, further comprising
   a fifth transistor, through which the capacitor is connected arranged between the gate of the second transistor of the first pixel and the gate of the second transistor of the second pixel, for adjusting a dynamic range.

6. An imaging system comprising
   an imaging apparatus according to claim 1; and
   a signal processing unit for processing the signal output from the imaging apparatus.

7. The imaging system according to claim 6, further comprising
   a recording unit for recording a signal outputted from the signal processing unit;
   a radiation source generating an electro-magnetic wave;
   a display unit for displaying based on the signal outputted from the signal processing unit; and
   a transfer processing unit for transferring the signal outputted from the signal processing unit.

8. An imaging apparatus comprising:
   first and second pixels each including a conversion element, a transfer transistor for transferring a signal from the conversion element and an amplifying transistor for amplifying a signal outputted from the transfer transistor, wherein a gate of the amplifying transistor of the first pixel is connected to a gate of the amplifying transistor of the second pixel; and
   a driving circuit connected to a gate of the transfer transistor of the first pixel and to a gate of the transfer transistor of the second pixel, wherein
   the driving circuit turns ON the transfer transistor of the first pixel and turns OFF the transfer transistor of the second pixel, to output a signal from the first pixel.

9. A driving method of an imaging apparatus comprising:
   first and second pixels each including a conversion element, a transfer transistor for transferring a signal from the conversion element and an amplifying transistor for amplifying a signal outputted from the transfer transistor, wherein a gate of the amplifying transistor of the first pixel is connected to a gate of the amplifying transistor of the second pixel, wherein the method comprising a step of
   turning ON the transfer transistor of the first pixel while turning OFF the transfer transistor of the second pixel, to output a signal from the first pixel.

* * * * *